United States Patent [19]
Iwasaki

[11] Patent Number: 5,671,054
[45] Date of Patent: Sep. 23, 1997

[54] METHOD AND APPARATUS FOR MEASURING POSITION OF PATTERN FORMED ON A SUBSTRATE HAVING A THICKNESS

[75] Inventor: Masaya Iwasaki, Yokohama, Japan

[73] Assignee: Nikon Corporation, Japan

[21] Appl. No.: 581,974

[22] Filed: Jan. 2, 1996

[30] Foreign Application Priority Data

Jul. 18, 1995 [JP] Japan .................................. 7-203770

[51] Int. Cl.$^6$ .................................................. G01B 11/30
[52] U.S. Cl. ...................... 356/375; 356/371; 250/559.29
[58] Field of Search ..................... 356/394, 375, 356/371, 401, 357, 358; 250/559-29

[56] References Cited

U.S. PATENT DOCUMENTS

| | | | |
|---|---|---|---|
| 5,459,577 | 10/1995 | Ototake et al. | 356/371 |
| 5,539,521 | 7/1996 | Otokate et al. | 356/371 |

Primary Examiner—David C. Nelms
Assistant Examiner—Amanda Merlino
Attorney, Agent, or Firm—Pennie & Edmonds LLP

[57] ABSTRACT

The thickness of a substrate is one of the most important parameters in detecting the flexure of the substrate. The thickness of a reference substrate disposed on a stage and its amount of flexure are measured. Thus measured data are stored in a memory of apparatus. Then, the apparatus measures the thickness of a substrate to be measured. The data concerning thus measured thickness of the substrate to be measured and the data concerning the thickness and amount of flexure of the reference substrate stored in the memory are utilized to calculate the amount of flexure of the substrate to be measured. This apparatus measures the pattern position of the substrate to be measured in thus flexed state. The apparatus corrects thus measured pattern position of the substrate to be measured on the basis of the amount of flexure which has been indirectly measured as mentioned above.

21 Claims, 11 Drawing Sheets

Fig. 4
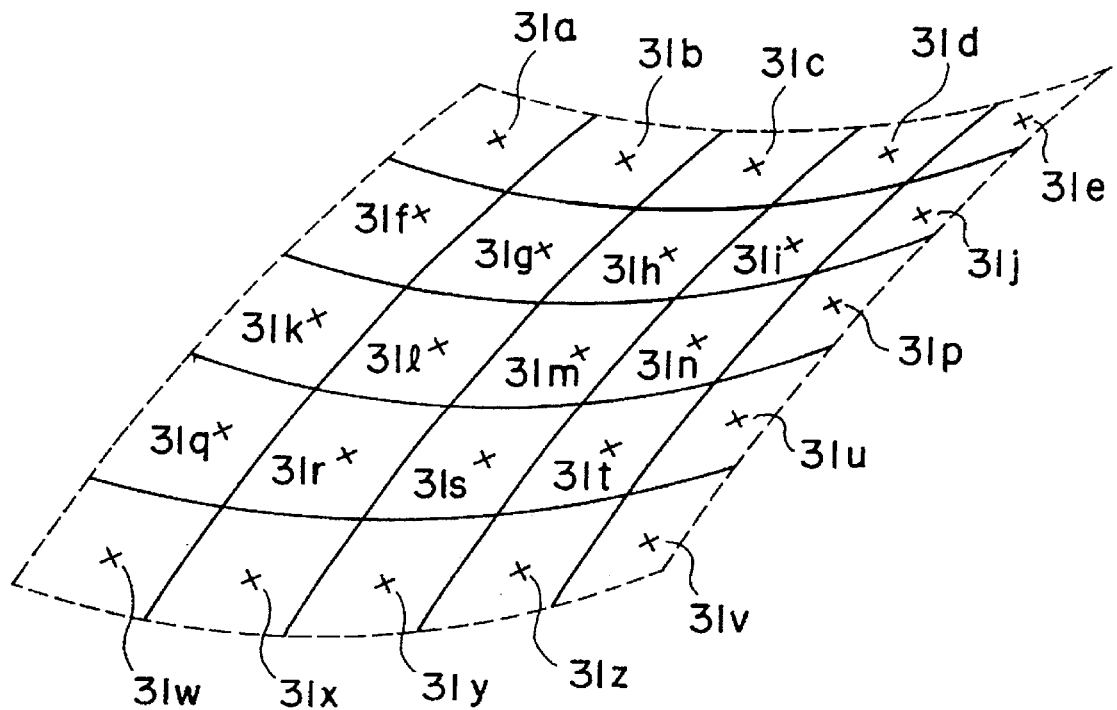
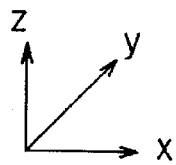
Fig. 6
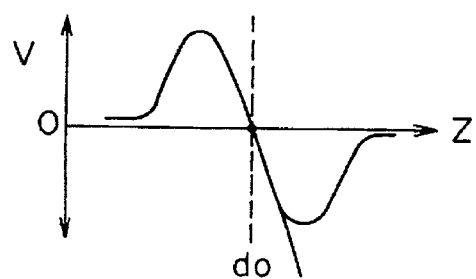

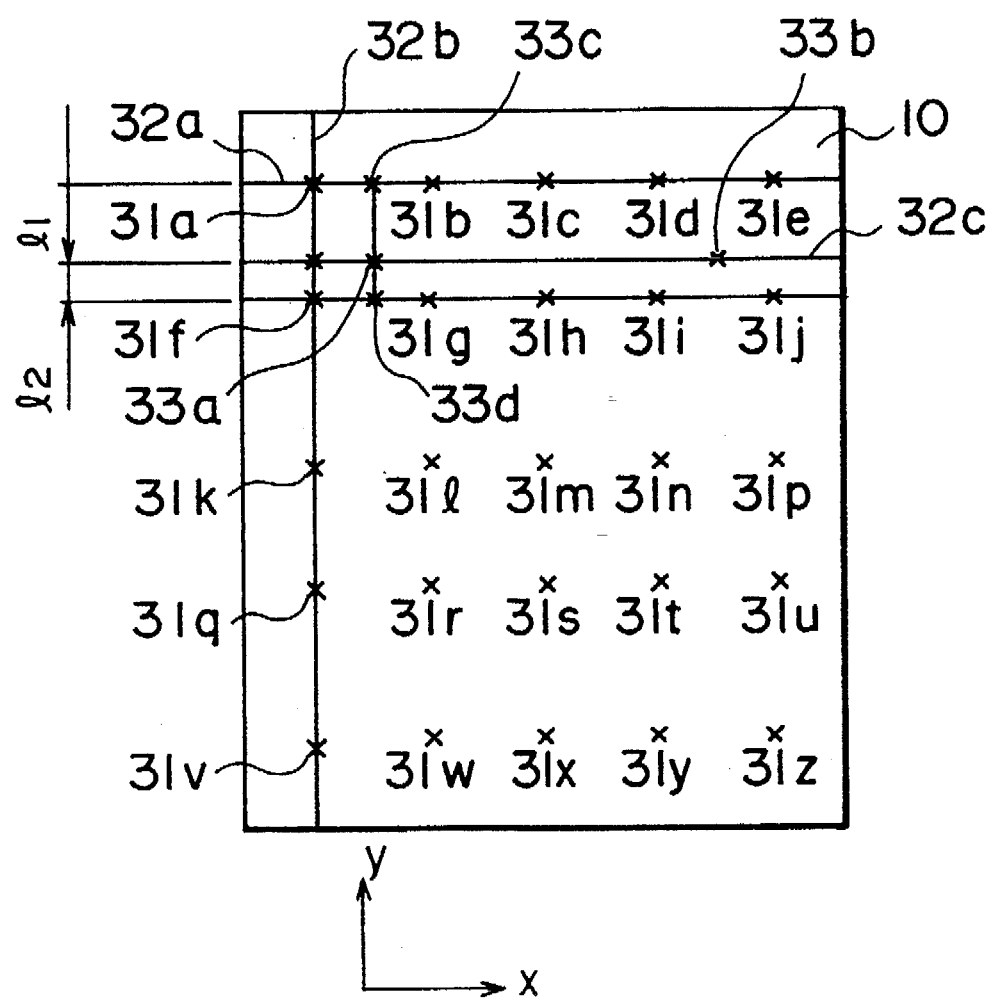

METHOD AND APPARATUS FOR MEASURING POSITION OF PATTERN FORMED ON A SUBSTRATE HAVING A THICKNESS

BACKGROUND OF THE INVENTION

1. Field of the Invention

The present invention relates to a method for measuring the position of a pattern formed on a substrate and, in particular, to method and apparatus for accurately measuring the position of a pattern formed on a mask or reticle, for example, which is used in a projection exposure apparatus.

2. Related Background Art

When the position of a pattern formed on a substrate such as a mask or reticle is to be measured, the substrate to be measured is supported on a stage and an edge of the pattern is optically detected. U.S. Pat. No. 5,459,577 (Japanese Laid-Open Patent Application (KOKAI) Hei No. 5-332761) discloses method and apparatus in which measured data of a reference (standard) substrate is used to correct the data of the pattern position on a substrate to be measured.

SUMMARY OF THE INVENTION

As compared with the conventional method in which only the measured data of a reference (standard) substrate is used to correct the data of the pattern position on a substrate to be measured, the data of the pattern position can be corrected more accurately in accordance with the present invention. In particular, in the current state of the art where a finer pattern has been formed on the substrate with a higher density, the method of the present invention is useful in that a more sufficient accuracy can be obtained in the measurement of the pattern position than the conventional method.

By taking into account the fact that, in the actually manufactured substrates, their thickness vary from substrate to substrate and that the amount of flexure in the substrate to be measured largely depends on the thickness thereof, the inventor has accomplished the method and apparatus in accordance with the present invention.

Namely, the thickness of a substrate is one of the most important parameters in detecting the flexure of the substrate. Accordingly, when the thickness (or surface height) of the substrate to be measured is actually measured to determine a thickness error and the pattern position is corrected based thereon, accuracy in measurement of the pattern position can be improved.

In the apparatus in accordance with the present invention, in the first place, the thickness of a reference substrate disposed on a stage and its amount of flexure are measured. Thus measured data are stored in a memory of the apparatus. Then, the apparatus measures the thickness of a substrate to be measured. The data concerning thus measured thickness of the substrate to be measured and the data concerning the thickness and amount of flexure of the reference substrate stored in the memory are utilized to calculate the amount of flexure of the substrate to be measured. Thus, the amount of flexure of the substrate to be measured at the time when it is disposed on the stage is indirectly measured by this apparatus.

Then, this apparatus measures the pattern position of the substrate to be measured in thus flexed state. The apparatus corrects thus measured pattern position of the substrate to be measured on the basis of the amount of flexure which has been indirectly measured as mentioned above. Accordingly, regardless of the thickness of the substrate to be measured, the apparatus can measure the pattern position of the substrate to be measured.

Also, in the present invention, the thickness of the substrate to be measured (or surface height of the substrate to be measured mounted on a stage) is actually measured and the measurement position of the pattern is corrected in view of the thickness error with respect to the reference substrate. Namely, based on the form of flexure of the reference substrate, a first correction amount with respect to the pattern position is determined as a theoretical value. Then, the thickness (or surface height) is actually measured for each substrate to be measured and its thickness error amount with respect to the thickness of the reference substrate is detected. Based on this thickness error amount, the first correction amount is amended to compute a second correction amount. Then, based on this second correction amount, the pattern position of the substrate to be measured is corrected.

Here, the thickness of the substrate to be measured is determined when its surface height is detected. Also, it is desirable that the surface height of the substrate to be measured be measured in proximity to its supporting point.

Also, when the pattern position is measured not only in the substrate to be measured having a thickness error in manufacture as mentioned above but in each of a plurality of substrates to be measured having standards concerning thickness different from each other, a reference amount of displacement of the pattern resulting from the flexure of the substrate is determined beforehand and then the difference between the reference substrate and each substrate to be measured is detected. When the amount of displacement is amended on the basis of this difference in thickness and then the results of measurement of the pattern position are corrected, accuracy in measurement can be improved in a similar manner. Also, since it is unnecessary for the amount of displacement to be stored for each thickness of the substrates to be measured, the storage data can be largely reduced. Though it is sufficient to determine the amount of displacement of the pattern in a single reference substrate resulting from its flexure in this case, it is desirable that, when the difference in thickness between the substrates to be measured is extremely large, the amount of displacement of the pattern in each of a plurality of substrates having different thickness values resulting from its flexure be determined.

Instead of storing the amount of displacement in the pattern in the reference substrate caused by the flexure thereof, the form of flexure of the reference substrate (height position of the substrate surface, specifically) may be approximated by a function (e.g., quaternary function) in which the position of the substrate within a horizontal plane is used as a variable, so that a coefficient (parameter) of thus approximated function may be stored. Alternatively, the gradient in the reference surface corresponding to the form of flexure thereof may be stored. In the latter case, in particular, it is desirable that the substrate be divided into a plurality of areas so that the gradient in each area is stored. In cases where the deflecting form (function) or gradient is stored, the amount of displacement in the pattern caused by the flexure is computed on the basis of thus stored data.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 4 is an explanatory view showing the operation of the apparatus of the present invention;

FIG. 6 is a graph explaining how the focal point is determined in an autofocus apparatus;

FIG. 8 is a view explaining how the reference correction amount is determined by actual measurement;

DETAILED DESCRIPTION OF THE PREFERRED EMBODIMENTS

Figure 1:
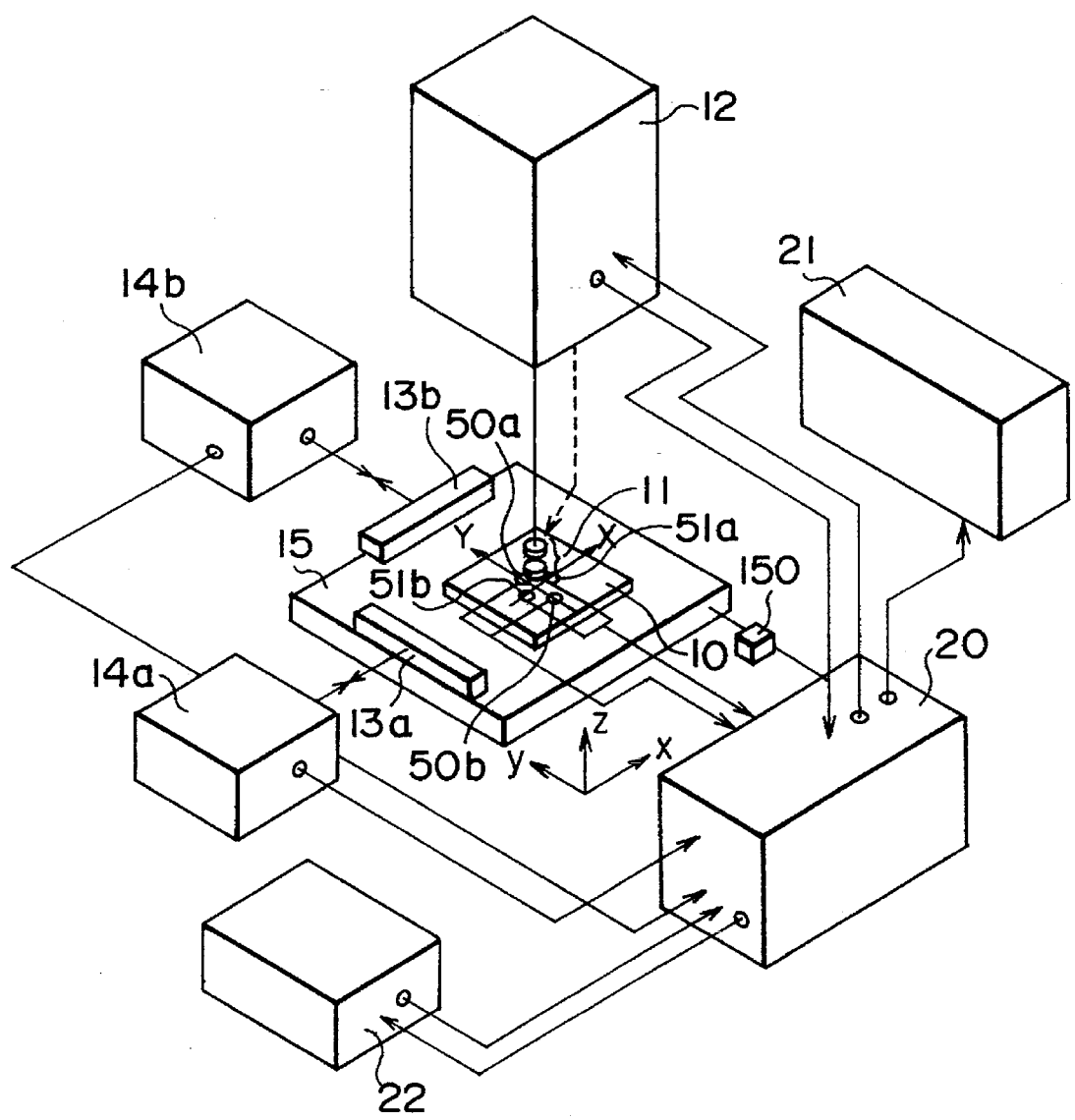
FIG. 1 is an overall configurational view showing a pattern measurement apparatus in accordance with the present invention.

In the following, the present invention will be explained in detail with reference to embodiments thereof. FIG. 1 shows a pattern measurement apparatus in accordance with an embodiment. This pattern position measurement apparatus is mainly used for measuring the position of a pattern on a photomask (reticle).

Figure 11:
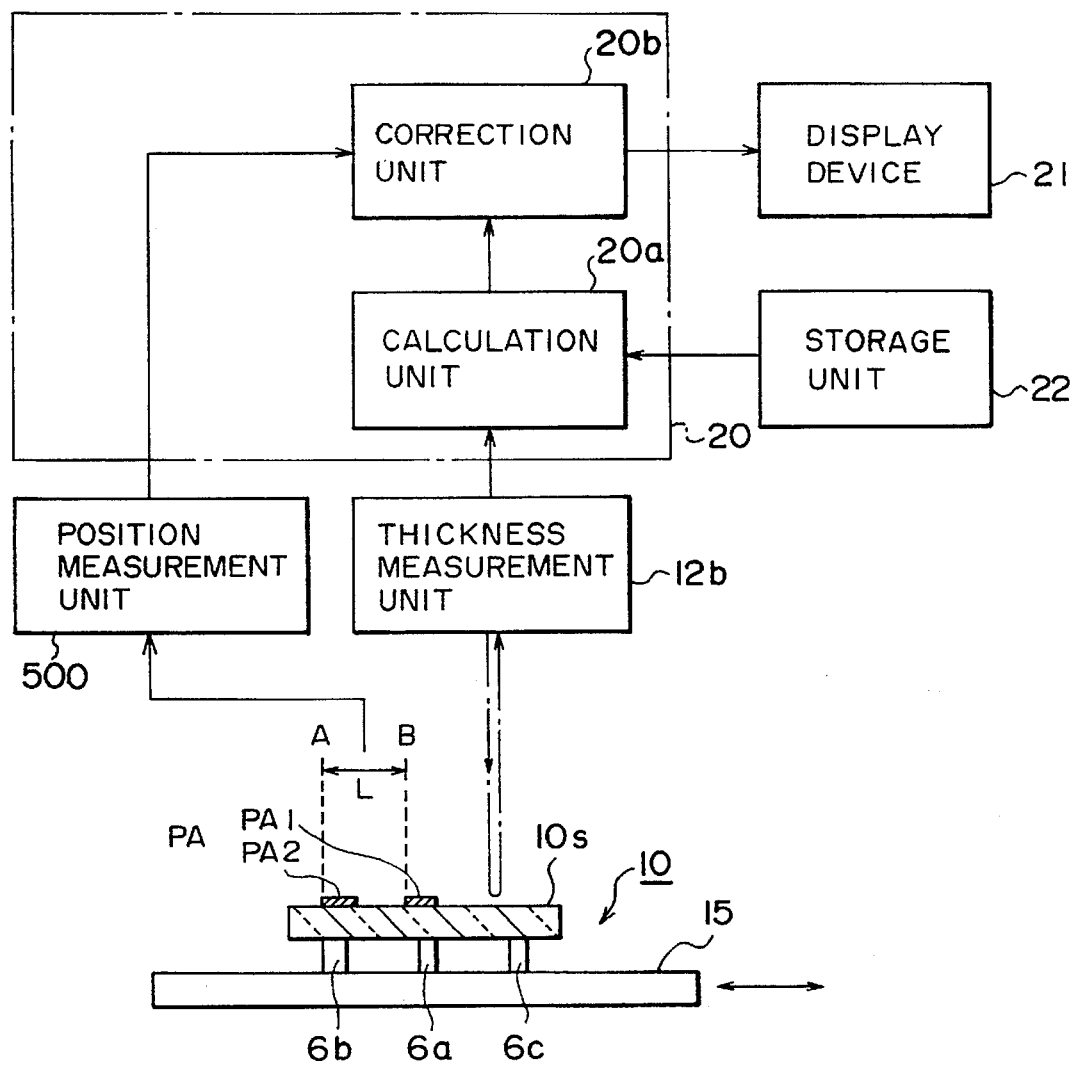
FIG. 11 is a block diagram showing a system configuration of the control portion of the pattern measurement apparatus.

FIG. 11 is a block diagram showing a system configuration in accordance with the embodiment. This apparatus comprises: a storage unit 22 for storing, as a first correction amount, an amount of displacement of a pattern caused by flexure of a predetermined reference substrate; a thickness measurement unit 12b for measuring a thickness error amount of a substrate to be measured with respect to the reference substrate; a calculation unit 20a for amending the first correction amount based on the thickness error amount so as to determine a second correction amount; a position measurement unit 500 (50a, 50b, 51a, 51b, 14a, 14b) for measuring a position of a pattern PA formed on the substrate 10 to be measured; and a correction unit 20b for correcting thus measured position of the pattern PA based on the second correction amount. The pattern PA is comprised of line patterns PA1 and PA2.

The distance L between the edges of the line patterns PA1 and PA2 is detected by using the position measurement unit 500.

Figure 12:
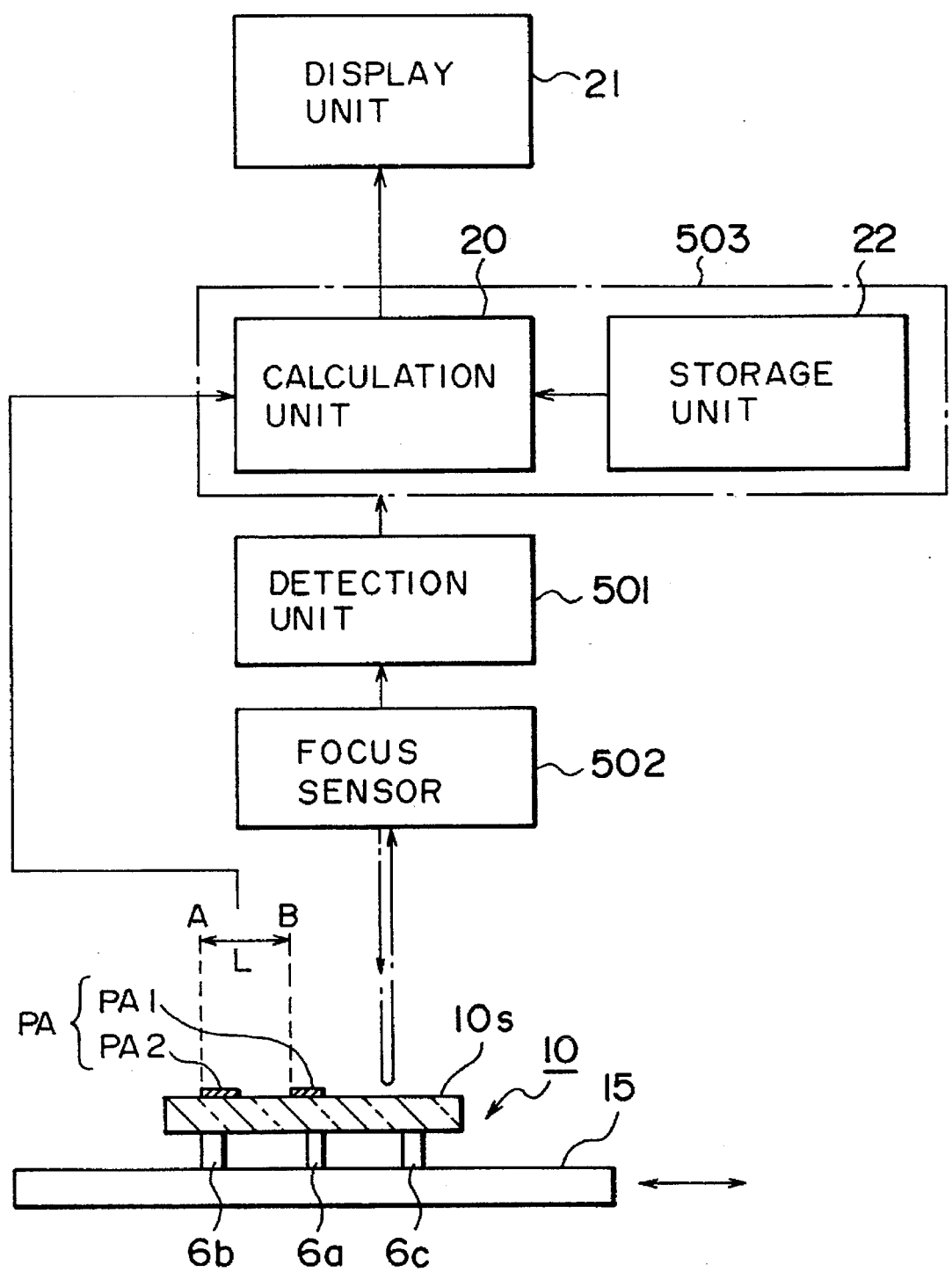
FIG. 12 is a block diagram showing another system configuration of the control portion of the pattern measurement apparatus.

Further, FIG. 12 is a block diagram showing another system configuration according to the embodiment. This apparatus comprises: a detection unit 501 for detecting a difference in thickness between a substrate 10 to be measured which is mounted on a stage 15 and a predetermined reference substrate; and a correction unit 503 which amends, based on thus detected difference in thickness, an amount of displacement of the pattern caused by flexure due to the weight of the reference substrate so as to correct, based on thus amended amount of displacement, results of measurement of the pattern position. The pattern position data is supplied to the correction unit 503. This correction unit 503 has a storage unit 22 for storing a gradient caused by flexure of the reference substrate; and a calculation unit 20 for computing, based on thus stored gradient at a point where the pattern position is measured, an amount of displacement of the pattern and amending thus computed amount of displacement by the difference in thickness. Further, this apparatus comprises a focus sensor 502 for measuring a surface height of the substrate 10 to be measured mounted on the stage 15, wherein the detection unit 501 determines, based on an output of the focus sensor 502, the difference in thickness. The detection unit 501 and the focus sensor 502 may consist of the autofocus device 12b.

These system configurations are constructed using computers, and the apparatuses are embodied as follows:

FIG. 1 shows a configuration of this apparatus. The pattern position measurement apparatus in this embodiment is used for detecting the position of a minute pattern (not depicted) formed on a substrate 10 such as a reticle and comprises an optical device 12; an XY stage 15 on which the substrate 10 is mounted; an objective lens 11 disposed above the substrate 10; movable mirrors 13a and 13b disposed at end portions on the upper surface of the XY stage 15; interferometers 14a and 14b for detecting the positions of the XY stage 15 in X- and Y-directions, respectively; light-receiving devices 50a, 50b, 51a, and 51b disposed in the periphery of the objective lens 11; a display device 21 for displaying the measured pattern position; a driving device 150 for driving the XY stage 15; a storage device (memory) 22 for storing a predetermined data; and a control device (processor) 20 for performing the collective control of the whole apparatus.

Figure 2A:
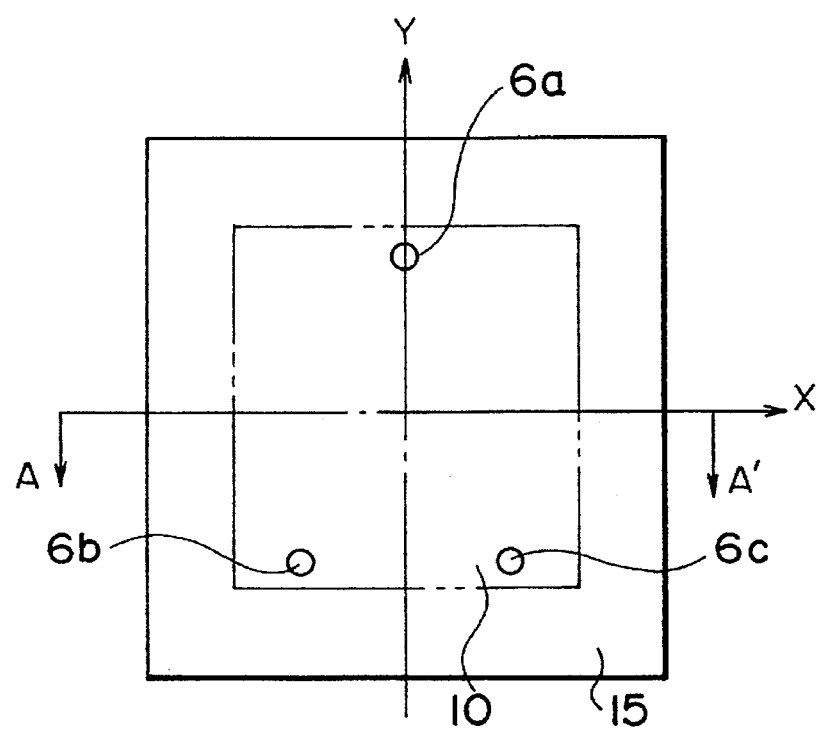
FIG. 2A is a plan view showing a substrate used in the pattern measurement apparatus of the present invention together with a stage.
Figure 2B:
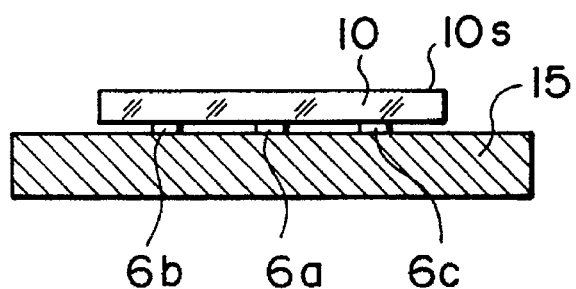
FIG. 2B is a cross-sectional view of the object shown in FIG. 2A taken along line A–A' thereof.

As shown in FIGS. 2A and 2B, the substrate 10 is mounted on substrate-mounting means (pins) 6a, 6b, and 6c, which are disposed at three positions on the XY stage 15, without being absorbed thereby, with its pattern-forming surface 10s facing upward.

Figure 3:
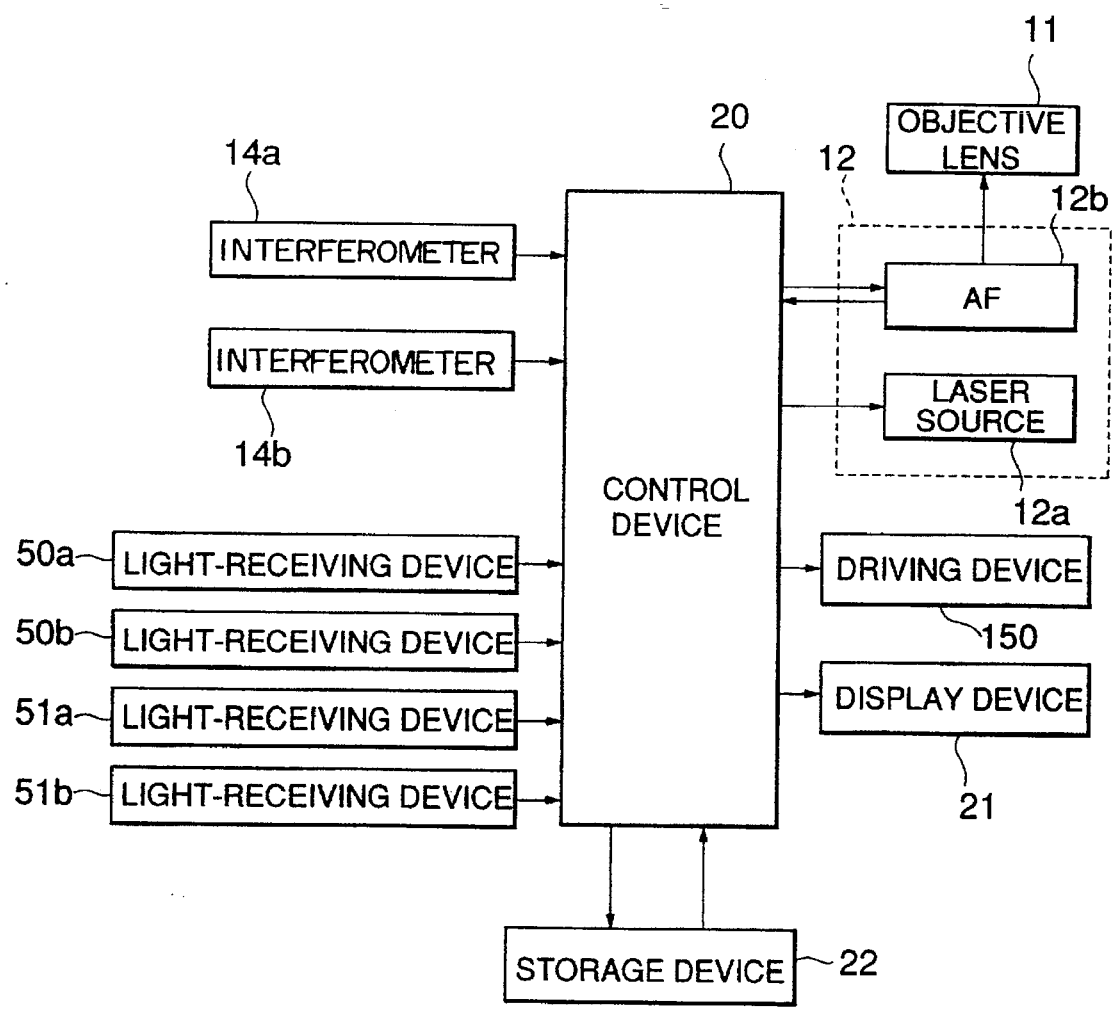
FIG. 3 is a block diagram showing a configuration of the control portion of the pattern measurement apparatus of the present invention.

As shown in FIG. 3, the optical device 12 comprises a laser source 12a, which irradiates the substrate 10 with a laser spot by way of the objective lens 11, and An autofocus device 12b which drives the objective lens 11 in Z-direction so as to automatically adjust the focus position thereof. The pattern formed on the substrate 10 is enlarged by the objective lens 11 so as to form an image at a predetermined position within the optical device 12. As a method for detecting a focal point by the autofocus device 12b, the synchronous detection method disclosed in Japanese Utility Model Publication (KOKOKU) Sho No. 57-44325, for example, can be utilized. This autofocus device 12b detects the surface height of the substrate 10 and transmits a signal corresponding to this height to the control device 20. The function of the device 12b is explained in more detail later.

The driving device 150 is provided with a motor (not depicted) which moves the XY stage 15 in two-dimensional directions of X and Y. The interferometers 14a and 14b irradiate the reflecting surfaces of the movable mirrors 13a and 13b and the reflecting surface of a fixed mirror (not depicted) with length-measuring laser beams and receive thus reflected light components, thereby detecting the position of the XY stage 15 and then transmitting its positional information to the control device 20. The four light-receiving devices 50a, 50b, 51a, and 51b receive the scattering light components or diffracted light components generated at edge portions of irregularities in the pattern on the substrate 10 and transmit their detection signals to the control device 20. Based on these edge detection signals, the control device 20 detects edge portions of the pattern. A method for detecting such an edge is disclosed in detail in U.S. Pat. No. 4,112,309 (Japanese Patent Publication (KOKOKU) Sho No. 56-25964).

In the storage device 22, the amount of two-dimensional displacement (in x- and y-directions in FIG. 1) of the pattern position (reference correction amount) caused by flexure at a plurality of places in the substrate 10 due to the tare weight thereof has been stored beforehand. Also, a plurality of areas are defined in the substrate 10 so as to correspond to the places where such correction amounts are determined. The data of these areas are stored in the storage device 22 as well. For example, as shown in FIG. 4, assuming that the correction amounts determined at 25 places in the substrate 10 are stored in the storage device 22, the control device 20 defines 25 areas whose centers are positions (31a to 31n and 31p to 31z) at which the correction amounts have been determined. These correction amounts may be determined by actual measurement as well as by simulation techniques such as finite element method. A method for computing the correction amount by actual measurement will be explained later in detail.

In the storage device 22, individual reference correction amounts (first correction amounts) $\Delta x$ and $\Delta y$ with respect to a plurality of kinds of substrates, in which at least one of material, form, and size thereof is different, are stored. Here, it is assumed that, for a plurality of substrates in which a forming condition other than thickness (e.g., material or size) is different, a reference correction amount for only one kind of thickness is stored for each substrate. This reference correction amount can be amended according to the actual thickness of the substrate to be measured. For example, when the thickness of the reference substrate (ideal thickness) is t and the actual thickness of the substrate to be measured is t', the difference $\Delta t$ therebetween is taken as a thickness error amount by which the reference correction amount is amended. For example, assuming that thus corrected reference correction amounts (second correction amounts) are $\Delta x'$ and $\Delta y'$, they can be computed from the following equations:

$$\Delta x' = \Delta x - 1 \cdot t/(t - \Delta t) = \Delta x - t/t'$$

$$\Delta y' = \Delta y - 1 \cdot t/(t - \Delta t) = \Delta x - t/t'$$

As the amount of flexure in the substrate largely depends on the thickness of the substrate, it becomes important to convert the reference correction amount in view of the thickness error amount.

Figure 5:
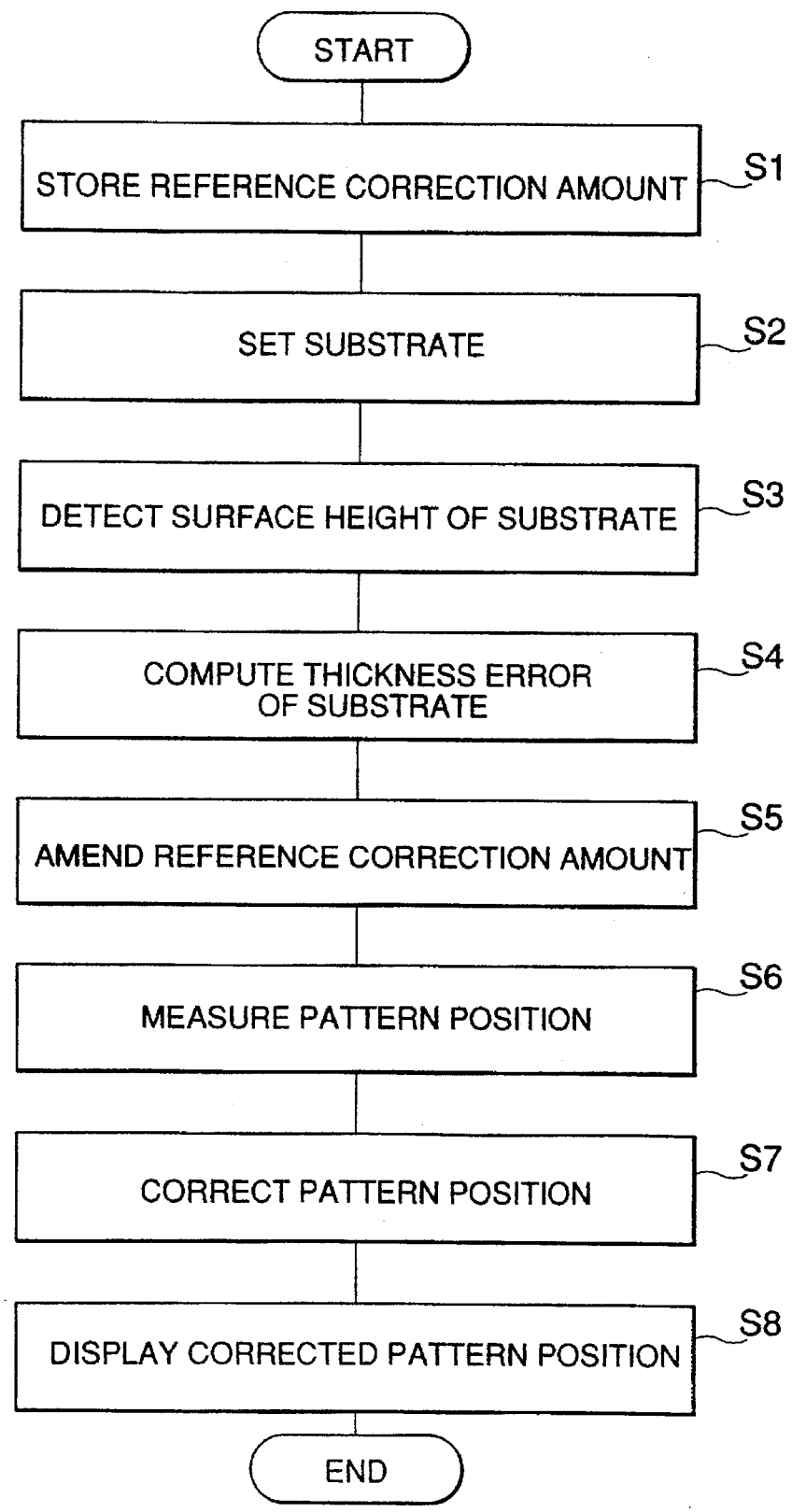
FIG. 5 is a flow chart showing the action of the apparatus of the present invention.

In the following, the overall action of the pattern position measurement apparatus configured as mentioned above will be explained with reference to the flow chart of FIG. 5. Here, a reference correction amount has been stored in the storage device 22 beforehand (step S1). Then, a substrate to be measured (substrate 10) is set on the substrate-mounting means 6a, 6b, and 6c on the XY stage 15 with its pattern-forming surface facing upward (step S2).

Figure 10:
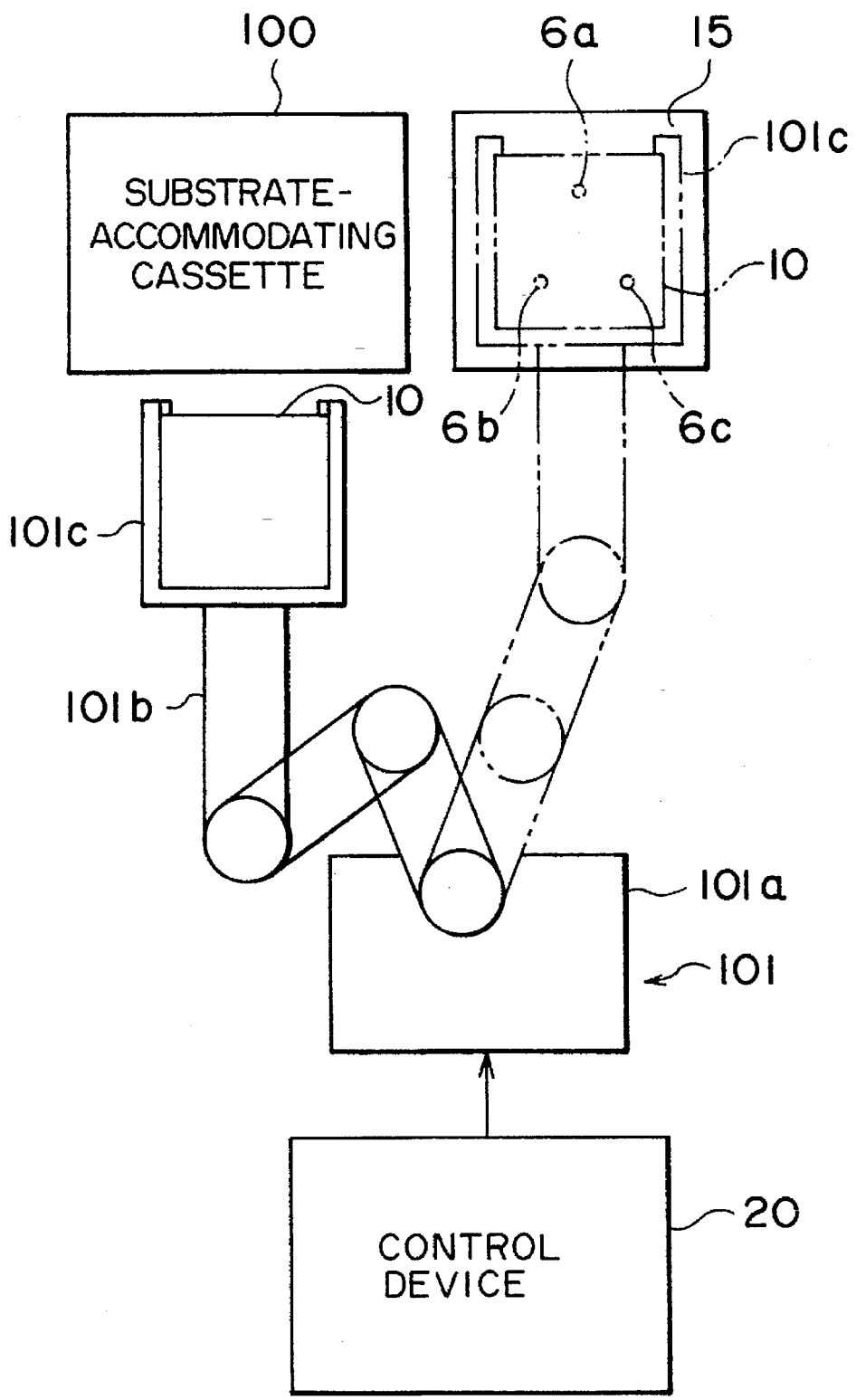
FIG. 10 is a view explaining how a substrate is transferred.

More specifically, as shown in FIG. 10, the substrate 10 to be measured is accommodated in a substrate-accommodating cassette 100 such that it can be transferred onto the stage 15 by a transfer robot 101, which comprises a main body 101a, an arm 101b extending therefrom, and a fork 101c attached to a tip of the arm 101b, so as to be mounted on the substrate-mounting means 6a, 6b, and 6c.

Thereafter, the XY stage 15 is moved such that one of the substrate-mounting means 6a, 6b, and 6c is positioned on the optical axis of the optical device 12, where the position (height) of the surface of the substrate 10 is detected by the autofocus device 12b (step S3).

Here, a brief explanation will be provided for how the autofocus device 12b detects a focal point. First, by way of the objective lens 11, the laser beam from the laser source 12a forms a spot-like (or slit-like) image on the substrate 10 and then the reflected light from the substrate 10 forms an image again by way of the objective lens 11. At this time, the position of a pin-hole (or slit) is subjected to a simple harmonic motion in the optical axis direction (Z-axis direction) centered at a predetermined in-focus plane and then the transmitted light from the pin-hole (or slit) is received by a photodetector (not depicted). Thus transmitted light is photoelectrically converted by this photodetector and the output signal obtained by this photoelectric conversion is synchronously detected (synchronously rectified) by the frequency of the simple harmonic motion. As a result, an S-curve signal, in which the voltage value with respect to the position in Z-direction changes like S as shown in FIG. 6, is obtained.

This S-curve signal has a characteristic such that defocus amount d and voltage value V have a linearity with respect to each other within a small region in front and behind of an focal point d0, while the voltage value V becomes zero at the focal point d0. Accordingly, based on the S-curve signal, the height of the surface of the substrate 10 in Z-direction with respect to the focal point d0, namely, the distance between the ideal horizontal plane (reference plane) for moving the XY stage 15, which is two-dimensionally moved while the substrate 10 being mounted thereon, and the substrate 10 can be easily detected.

The control device 20 computes the thickness of the substrate 10 from three elements composed of the position of the substrate 10 in Z-axis direction, the pre-stored position of the upper surface of the XY stage 15, and the distance between the XY stage 15 and the substrate 10 (height of the substrate-mounting means 6a, 6b, and 6c; cf. FIG. 2B). Then, the thickness (theoretical thickness) t of a reference substrate which has been formed under substantially the same conditions as those of the substrate 10 (except for the thickness) stored in the storage device 22 is read out and then the difference between this value t and the thickness t' of the actual substrate 10 is computed as a thickness error amount $\Delta t$ (step S4). Thereafter, based on this thickness error amount $\Delta t$, the reference correction amounts (theoretical correction amounts) $\Delta x$ and $\Delta y$ are altered and thus altered reference correction amounts $\Delta x'$ and $\Delta y'$ are stored in the storage device 22 (step S5).

Thereafter, in response to a measurement starting instruction from an input device which is not depicted, the control device 20 controls the driving device 150 so as to place the XY stage 15 at its initial position, while monitoring the stage position signals from the interferometers 14a and 14b. Then, the control device 20 sequentially moves the XY stage 15 from the initial position such that the surface thereof is relatively scanned with the spot light from the optical device 12. When the spot light impinges on a pattern edge of the substrate surface, a scattering light component is generated, which is then detected by light-receiving elements 50a, 50b, 51a, and 51b. When the light-receiving elements 50a, 50b, 51a, and 51b detects the scattering light component, they output its corresponding edge detection signal to the control device 20.

When the edge detection signal is input, the control device 20 reads out the position of the pattern edge at that time from the interferometers 14a and 14b (step S6), while reading out the correction amount ($\Delta x'$ and $\Delta y'$) in the area including that pattern position from the storage device 22. The correction amount at this time has been amended by the thickness error $\Delta t$ of the substrate as mentioned above.

Thereafter, based on the correction amount read out from the storage device 22, the control device 20 corrects the position of the pattern edge in the two-dimensional directions of X and Y (step S7). Then, based on thus corrected edge position, the control device 20 determines the pattern position and the line width, which are subsequently stored in the storage device 22 and displayed on the display device 21 (step S8). Here, the control device 20 stores the corrected edge position in the storage device 22 and, in response to an operator's instruction from an input device which is not depicted, calculates the interval of the pattern on the substrate on the basis of the stored edge position, thereby displaying thus calculated interval on the display device 21.

In the foregoing explanation, for a plurality of substrates in which a forming condition other than thickness is different, a reference correction amount for only one kind of thickness is stored in the storage device 22. However, when their thickness values are largely different from each other while the forming conditions other than thickness are substantially the same, it is preferable that, for a plurality of kinds of substrates having different thickness values, their reference correction amounts are determined and stored. In this case, the reference correction amount of a reference substrate having a thickness value closest to the thickness of the substrate to be measured is read out from the storage device 22 and then thus read-out reference correction amount is amended by the difference in thickness between the substrate to be measured and this reference substrate.

Also, though the amount of displacement caused by flexure of the reference is stored as the reference correction amount in the storage device 22 in the foregoing explanation, a form of flexure of the reference substrate (surface height position of the substrate, specifically), for example, may be approximated by a function in which the position of the substrate within a horizontal plane is used as a variable (e.g., quaternary function) so that a coefficient (parameter) of thus approximated function may be stored. In the latter case, in particular, it is desirable that the substrate be divided into a plurality of areas so that the gradient in each area is stored. In cases where the deflecting form (function) or gradient is stored, the amount of displacement in the pattern caused by the flexure is computed on the basis of thus stored data.

Figure 7A:
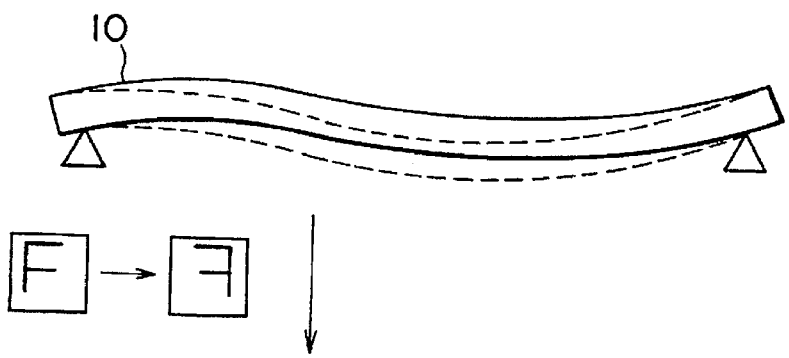
FIGS. 7A to 7D are views explaining how a reference correction amount to be stored in a storage device is determined.
Figure 7B:
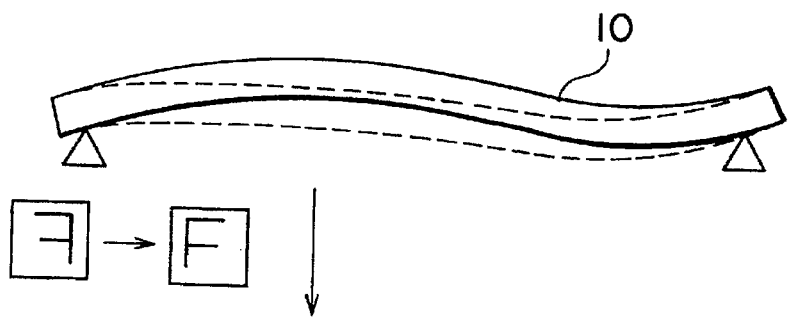

In the following, with reference to FIGS. 7A to 7D, a brief explanation will be provided for a basic method (principle) for determining the reference correction amount to be stored in the storage device 22. FIGS. 7A to 7D show a cross section of the substrate 10 mounted on substrate-mounting means at three positions on the stage 15. The continuous curves therein indicate a state in which the substrate is not flexed by its tare weight, while broken curves indicate a state in which the substrate is flexed by the tare weight. First, in the state shown in FIG. 7A, the form of flexure caused by the tare weight of the substrate is detected. Then, from the state of FIG. 7A, the substrate is vertically reversed as shown in FIG. 7B and the form of flexure caused by the tare weight of the substrate at this time is detected. The form of flexure of the substrate can be easily determined when the autofocus device 12b is used to measure the height of the substrate surface from a reference plane with a predetermined interval.

Figure 7C:
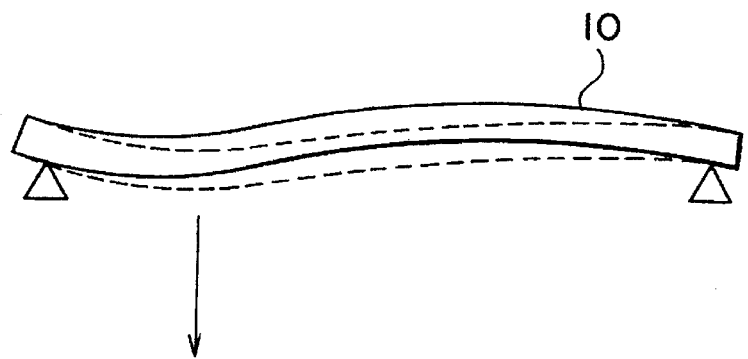
Figure 7D:
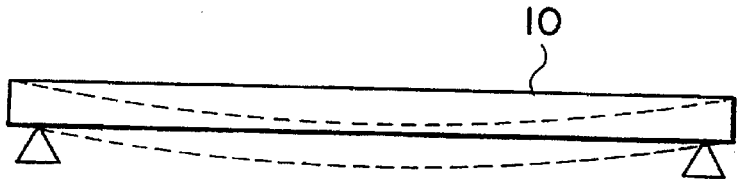

When the data concerning the form of flexure detected in the state of FIG. 7B is depicted as a laterally-reversed mirror image, a flexure form such as that shown in FIG. 7C is obtained. Further, the average data of the data concerning the form of flexure shown in FIG. 7A and that shown in FIG. 7C yields a form of flexure such as that shown in FIG. 7D. The form of flexure of the substrate in FIG. 7D indicates that of an ideal substrate without deformation. Namely, from the average data of the above-mentioned forms of flexure, a form of flexure caused by the tare weight of the substrate alone can be determined without being influenced by the deformation (wariness) of the substrate. Then, from the average data, the gradient values at a plurality of places on the substrate surface are computed and then amounts of two-dimensional displacement caused by these gradient values are computed at a plurality of places so as to be stored in the storage device 22.

Though the substrate 10 is mounted on the XY stage 15 with its pattern surface facing upward in the foregoing embodiment, it is mainly used as being supported with its pattern surface facing downward. Accordingly, as disclosed in U.S. Pat. No. 5,459,677 (Japanese Laid-Open Patent Application (KOKAI) Hei No. 6-18220), for example, correction may be made also in view of the flexure of the substrate 10 generated when the substrate is supported with its pattern surface facing downward, thereby enabling the pattern position to be detected under a condition closer to the condition under which the substrate is actually used. Here, the form of flexure generated when the substrate 10 is supported with its pattern surface facing downward has been determined beforehand outside of the apparatus by using a substrate which is of the same material and form as the substrate 10, for example.

While the basic method (principle) for determining the reference correction amount is explained in the foregoing with reference to FIGS. 7A to 7D, a detailed explanation will be provided in the following with respect to how the form of flexure of the substrate, which is generated when the substrate 10 is supported with its pattern surface facing upward, and a reference correction amount based thereon are determined by actual measurement. When the XY stage 15 is placed at its initial position, a height measurement point 31a shown in FIG. 8 is on the optical axis of the objective lens 11 of the optical device 12. The control device 20 reads out the output voltage of the autofocus device 12b at the time before its focus mechanism is activated, thereby measuring height H31 of the pattern-forming surface and storing it together with the position of the XY stage 15 corresponding to the height measurement point 31a.

The control device 20 successively stores height values H31b to H31n and H31p to H31z at height measurement points 31b to 31n and 31p to 31z, respectively, together with the positions of the XY stage 15 at these height measurement points. Then, based on the relationship between the height values of the height measurement points 31a to 31e arranged in X-direction and the position of the XY stage 15, the form of flexure at a line 32a extending in X-direction is approximated by the following quaternary expression:

$$Z=a_1x^4+a_2x^3+a_3x^2+a_4x+a_5$$

In the above expression, with respect to five data concerning z and X, there are five unknown quantities $a_1$ to $a_5$. Accordingly, the above quaternary expression is univocally determined.

In this manner, quaternary approximate expressions concerning the form of flexure are successively determined for height measurement points 31f to 31j, 31k to 31n and 31p, 31q to 31u, and 31v to 31z arranged in X-direction, respectively. Further, the form of flexure at a line 32b extending in Y-direction is approximated by the following quaternary expression:

$$Z=a_1y^4+a_2y^3+a_3y^2+a_4y+a_5$$

Similarly, quaternary approximate expressions concerning the form of flexure are successively determined for height measurement points 31b to 31w, 31c to 31x, 31d to 31y, and 31e to 31z arranged in Y-direction, respectively. As a result, as shown in FIG. 4, the form of flexure of the pattern-forming surface of the substrate 10 is obtained.

Next, after returning the XY stage 15 to its initial position, the control device 20 controls the driving device 150 so as to sequentially move the XY stage 15 from the initial position. As the substrate 10 is relatively scanned with the spot light from the optical device 12, an edge detection signal is output from the light-receiving devices 50a, 50b, 51a, and 51b. From the position signals from the interferometers 14a and 14b at the time when an edge of the pattern is detected, the control apparatus 20 reads out the position of the XY stage 15 at the time when the edge detection signal is output.

For example, it is assumed that an edge detection signal is output at pattern edge positions (referred to as "pattern position" in the following) 33a and 33b shown in FIG. 8. Then, the coordinate values corresponding to the locations of the pattern positions 33a and 33b are read out from the interferometers 14a and 14b so as to be stored. The control device 20 recognizes the X-coordinate value of the pattern position 33a and computes X-direction gradient values $\theta X_3$ and $\theta X_4$ at the height measurement points 33c and 33d on the approximate expression neighboring the pattern position 33a among the quaternary expressions previously determined. These gradient values $\theta X_3$ and $\theta X_4$ can be obtained when the previously computed quaternary approximate expression is differentiated and then the X-coordinate value is input therein.

In the case where the positional relationship between the pattern position 33a and the height measurement points 33c and 33d is such as that shown in FIG. 8, X-direction gradient $\theta X_1$ of the pattern position 33a is computed according to proportional distribution by the following expression:

$$\theta X_1=(l_2\theta X_3+l_1\theta X_4)/(l_1+l_2)$$

Also, X-direction gradient $\theta X_2$ at the other pattern position 33b is computed similarly.

In a similar manner, Y-direction gradients $\theta Y_1$ and $\theta Y_2$ are computed. Then, correction amounts ($\frac{1}{2}\cdot t\cdot\theta X_1$), ($\frac{1}{2}\cdot t\cdot\theta X_2$), ($\frac{1}{2}\cdot t\cdot\theta Y_1$), and ($\frac{1}{2}\cdot t\cdot\theta Y_2$) at the pattern positions 33a and 33b are respectively computed. Here, t refers to the thickness (reference thickness) of the substrate 10. These correction amounts are used to determine, from the coordinate values corresponding to the pattern positions detected by the interferometers 14a and 14b, coordinate values corresponding to the pattern positions in a state with no flexure. Here, the form of flexure in the line 32c extending in X-direction on which the pattern positions 33a and 33b are positioned is assumed to be in the form of flexure of a pattern-forming surface 33 shown in FIG. 9A which is a circular arc whose center is at point 0.

Since a neutral plane 10' neither expands nor contracts and the amount of change in size of the substrate 10 due to the deformation of the neutral plane 10' is so small that it can be neglected, the amount of correction can be directly determined from the gradient. Also, the correction amount in Y-direction can be considered in a similar manner.

When pattern positions are respectively measured in a plurality of substrates to be measured having substantially the same forming conditions other than thickness, in the first place, the autofocus device 12b is used to determine the form of flexure (approximate function) in the first substrate to be measured, as mentioned above, so as to compute a gradient value thereof and then, based on thus computed gradient value, the amount of displacement (correction amount) of the pattern is determined so as to be stored in the storage device 22. Thereafter, in the first substrate to be measured, the pattern position is corrected on the basis of thus determined correction amount; while, in the second or later substrate to be measured, the difference in thickness Δt (=t−t') between the thickness thereof and that of the first substrate to be measured is detected and, based on this difference in thickness Δt, the previously stored correction amount is amended, thereby amending the pattern position on the basis of thus amended correction amount.

In the foregoing, the explanation is provided for how to compute the correction amount used for converting the substrate 10, which is supported with its pattern-forming surface facing upward, into a state with no flexure. In the following, an explanation will be provided for a method for further converting this state to a state in which the substrate is supported with its pattern-forming surface facing downward (state of actual use).

From quaternary approximate expressions which have been stored beforehand, the control device 20 uses the above-mentioned proportional distribution to compute gradient values $\theta X_1'$, $\theta X_2'$, $\theta Y_1'$, and $\theta Y_2'$ as well as their correction amounts ($\frac{1}{2}\cdot t\cdot\theta X_1'$), ($\frac{1}{2}\cdot t\cdot\theta X_2'$), ($\frac{1}{2}\cdot t\cdot\theta Y_1'$), and ($\frac{1}{2}\cdot t\cdot\theta Y_2'$). These correction amounts are used to compute, from the coordinate values corresponding to the pattern positions in a state with no flexure, the coordinate values corresponding to the pattern positions 33a and 33b in a second flexure state which occurs when the substrate is supported with its pattern-forming surface facing downward. Here, the form of flexure in the line 32c extending in X-direction on which the pattern positions are located in the state with no flexure is assumed to be in the form of flexure of the pattern-forming surface 33 shown in FIG. 9B which is a circular arc whose center is at point 0'.

Figure 9A:
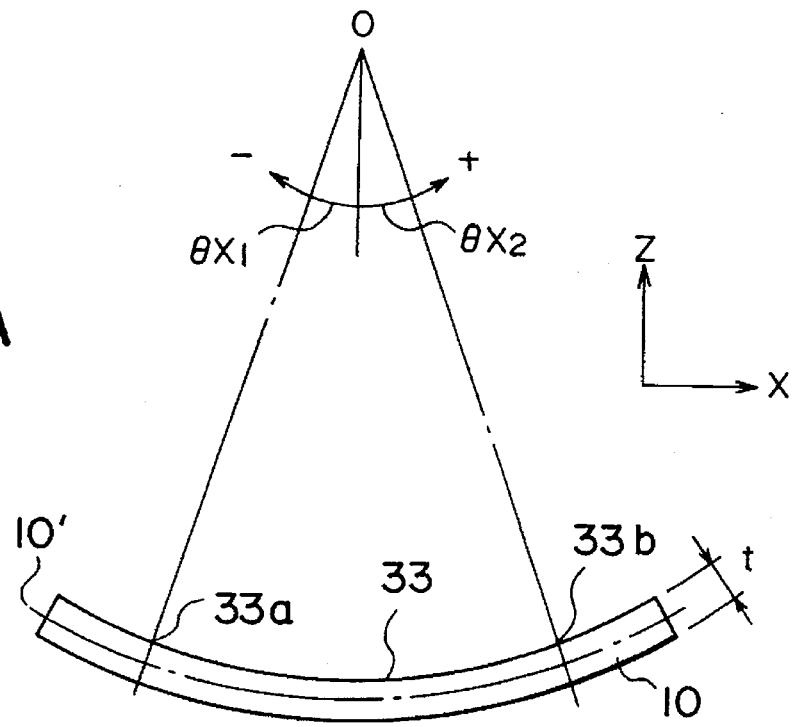
FIGS. 9A and 9B are explanatory views showing the operation of the present invention.

Thus determined pattern positions are similar to those obtained at the time when the substrate 10 is supported with its pattern-forming surface facing downward. In the state of flexure shown in FIG. 9A, to the distance between the pattern positions 33a and 33b contains an error of t($\theta X_1-\theta X_2$)/2 as compared with the case where the substrate 10 is placed at its ideal plane. Here, as shown in FIG. 9A, $\theta X_1$ and $\theta X_2$ become positive and negative when the gradient of the substrate 10 is upward on the right and left sides, respectively. In this case, the distance between the pattern positions 33a and 33b is measured longer and shorter when the difference in gradient ($\theta X_1 - \theta X_2$) is positive and negative, respectively. Also, when the substrate 10 has an inclination with respect to a horizontal plane, such an inclination is cancelled since the error is calculated from the difference between $\theta X_1$ and $\theta X_2$.

Figure 9B:
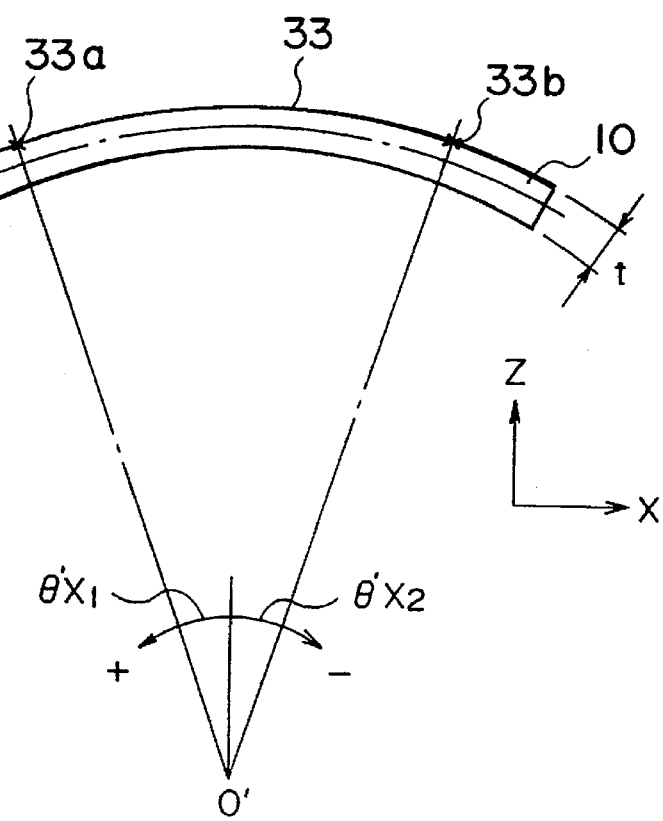

In the state of flexure shown in FIG. 9B, the distance between the pattern positions 33a and 33b contains an error of $t(\theta X_1' - \theta X_2')/2$ as compared with the case where the substrate 10 is placed at its ideal plane. Here, as shown in FIG. 9B, $\theta X_1'$ and $\theta X_2'$ become positive and negative when the gradient of the substrate 10 is upward on the right and left sides, respectively. In this case, the distance between the pattern positions 33a and 33b is measured longer and shorter when the difference in gradient ($\theta X_1' - \theta X_2'$) is positive and negative, respectively. Also, when the substrate 10 has an inclination with respect to a horizontal plane, such an inclination is cancelled since the error is calculated from the difference between $\theta X_1'$ and $\theta X_2'$.

Accordingly, the distance between the pattern positions 33a and 33b in the second state occurring when the substrate 10 is supported with its pattern-forming surface facing downward can be determined by $\{t(\theta X_1 - \theta X_2)/2\} - \{t(\theta X_1' - \theta X_2')/2\}$. Then, the thickness error $\Delta t$ is added to the ideal thickness t of the substrate according to the above-mentioned method, thereby yielding a more correct data concerning the pattern position based on the actual thickness t' of the substrate 10.

Without being restricted to the embodiments of the present invention explained in the foregoing, the design of the present invention can be altered in various manners within the scope of the concept of the invention defined by the claims. For example, without using the autofocus device 12b, the amount of vertical movement of the objective lens 11 may be read out by such means as encoder, interferometer, or potentiometer so as to detect the surface height of the substrate 10. Also, a Z stage which is vertically movable in Z-direction may be disposed on the XY stage 15 such that the amount of vertical movement of this Z stage is read out in addition to that of the objective lens 11.

As explained in the foregoing, since the thickness error (difference in thickness due to manufacturing error and specification) of the substrate to be measured is corrected, the present invention is effective in improving the accuracy in measurement as compared with the case where the pattern position formed on the substrate is corrected by the theoretical correction amount of the reference substrate alone.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A pattern-position measuring method in which a position of a pattern formed on a substrate to be measured is measured, said method comprising the steps of:

(a) measuring a thickness error amount of said substrate to be measured with respect to a reference substrate;

(b) using an amount of displacement of the pattern caused by flexure of said reference substrate as a first correction amount and amending said first correction amount based on said thickness error amount so as to determine a second correction amount;

(c) measuring a position of the pattern formed on said substrate to be measured; and (d) correcting said measured position of the pattern based on said second correction amount.

2. A method according to claim 1, wherein a surface height of said substrate to be measured is measured at said step (a) to determine said thickness error amount.

3. A method according to claim 2, wherein said substrate to be measured is mounted on a plurality of support means on a stage and said surface height is measured in proximity to said support means.

4. A method according to claim 1, wherein said first correction amount is determined on the basis of two kinds of amounts of flexure obtained when said reference substrate is supported on front and rear surfaces thereof, respectively.

5. A method for measuring a position of a pattern of a substrate to be measured mounted on a stage substantially horizontally, said method comprising the steps of:

amending, based on a difference between a thickness of said substrate to be measured and a thickness of a predetermined reference substrate, an amount of displacement of the pattern caused by flexure due to the weight of said reference substrate;

measuring a position of the pattern of said substrate to be measured; and then correcting, based on said amended amount of displacement, the measured pattern position.

6. A method according to claim 5, wherein a gradient caused by flexure of said reference substrate is stored beforehand, while, based on said stored gradient at a position where said pattern position is measured, an amount of displacement of said pattern is computed and said computed amount of displacement is amended by said difference in thickness.

7. A method for measuring a position of a pattern formed on a substrate to be measured, said method comprising the steps of:

(a) measuring a thickness of said substrate to be measured;

(b) measuring a position of said pattern; and then (c) correcting said measured position of said pattern based on data concerning the measured thickness of said substrate to be measured as well as data concerning a thickness of a reference substrate and an amount of flexure of said reference substrate stored in a storage device.

8. A method according to claim 7, wherein said step (c) is accomplished by the steps of:

computing a difference between the data concerning the thickness of said substrate to be measured and the data concerning the thickness of said reference substrate;

correcting, based on said difference, the data concerning the amount of flexure of said reference substrate; and then correcting, based on said corrected data concerning the amount of flexure of said reference substrate, said measured pattern position.

9. A method according to claim 7, further comprising the step of mounting said substrate to be measured on a plurality of support means on a stage.

10. A method according to claim 9, wherein said thickness is measured as a height of a surface of said substrate to be measured from a predetermined reference position in proximity to said support means.

11. An apparatus for inspecting a substrate to be measured in which a pattern is formed, said apparatus comprising:

a stage on which said substrate to be measured is disposed;

a memory which stores data concerning a thickness of a reference substrate and an amount of flexure of said reference substrate when said reference substrate is disposed on said stage;

a laser source which can irradiate a surface of said stage with a laser beam;

a photodetector disposed above said stage; and a processor which is electrically connected to said photodetector and can read out the data within said memory.

12. An apparatus according to claim 11, wherein said processor detects, based on a signal input from said photodetector, a position of said pattern and, based on said data read out from said memory, corrects said pattern position.

13. An apparatus according to claim 11, further comprising:

an objective lens disposed above said stage and an autofocus device which can move said objective lens.

14. An apparatus according to claim 11, further comprising at least three pins attached on said stage, wherein said stage can be moved to a position where the laser beam from said laser source can irradiate at least one of said pins.

15. A pattern-position measuring apparatus for measuring a position of a pattern formed on a substrate, said apparatus comprising:

a storage unit for storing, as a first correction amount, an amount of displacement of a pattern caused by flexure of a predetermined reference substrate;

a thickness measurement unit for measuring a thickness error amount of a substrate to be measured with respect to said reference substrate;

a calculation unit for amending said first correction amount based on said thickness error amount so as to determine a second correction amount;

a position measurement unit for measuring a position of a pattern formed on said substrate to be measured; and a correction unit for correcting said measured position of the pattern based on said second correction amount.

16. A pattern-position measuring apparatus according to claim 15, wherein said thickness measurement unit measures a surface height of said substrate to be measured and, based on said measured value, detects said thickness error amount.

17. A pattern-position measuring apparatus according to claim 16, wherein said substrate to be measured is substantially horizontally supported by a plurality of support means and mounted on a stage, while said thickness measurement unit measures said surface height in proximity to said support means on which said substrate to be measured is mounted.

18. A pattern-position measuring apparatus according to claim 16, wherein said thickness measurement unit is an autofocus device.

19. An apparatus for measuring a position of a pattern in a substrate to be measured which is substantially horizontally mounted on a stage, said apparatus comprising:

a detection unit for detecting a difference in thickness between said substrate to be measured which is mounted on said stage and a predetermined reference substrate and a correction unit which amends, based on said detected difference in thickness, an amount of displacement of the pattern caused by flexure due to the weight of said reference substrate so as to correct, based on said amended amount of displacement, results of measurement of the pattern position.

20. An apparatus according to claim 19, wherein said correction unit has a storage unit for storing a gradient caused by flexure of said reference substrate and a calculation unit for computing, based on said stored gradient at a point where said pattern position is measured, an amount of displacement of said pattern and amending said computed amount of displacement by said difference in thickness.

21. An apparatus according to claim 19, further comprising a focus sensor for measuring a surface height of said substrate to be measured mounted on said stage, wherein said detection unit determines, based on an output of said focus sensor, said difference in thickness.

* * * * *